United States Patent
Kawano et al.

(10) Patent No.: US 7,972,765 B2
(45) Date of Patent: *Jul. 5, 2011

(54) PATTERN FORMING METHOD AND A SEMICONDUCTOR DEVICE MANUFACTURING METHOD

(75) Inventors: Kenji Kawano, Yokohama (JP); Tsuyoshi Shibata, Kikuchi-gun (JP); Kei Hayasaki, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

This patent is subject to a terminal disclaimer.

(21) Appl. No.: 12/457,108

(22) Filed: Jun. 1, 2009

(65) Prior Publication Data
US 2009/0246710 A1 Oct. 1, 2009

Related U.S. Application Data

(63) Continuation of application No. 11/266,197, filed on Nov. 4, 2005, now Pat. No. 7,563,561.

(30) Foreign Application Priority Data

Nov. 5, 2004 (JP) ................................ 2004-322495

(51) Int. Cl.
*G03F 7/26* (2006.01)
(52) U.S. Cl. ........................................ 430/311; 430/330
(58) Field of Classification Search .................. 430/311, 430/322, 330
See application file for complete search history.

(56) References Cited

U.S. PATENT DOCUMENTS

| 6,100,012 | A | 8/2000 | Shi |
| 6,235,439 | B1 | 5/2001 | Whiting |
| 6,801,295 | B2 | 10/2004 | Inomata et al. |
| 6,881,058 | B2 | 4/2005 | Kawano et al. |
| 6,883,158 | B1 | 4/2005 | Sandstrom et al. |
| 7,563,561 | B2 * | 7/2009 | Kawano et al. ............... 430/311 |
| 2004/0197713 | A1 | 10/2004 | Ohfuji et al. |
| 2005/0130058 | A1 | 6/2005 | Rahman |

FOREIGN PATENT DOCUMENTS

| JP | 2000-277423 | 10/2000 |
| JP | 2001-102282 | 4/2001 |
| JP | 2002-252167 | 9/2002 |
| WO | WO 00/72090 A2 | 11/2000 |

OTHER PUBLICATIONS

Notification for Filing Opinion in the First Examination, dated Feb. 17, 2009, and First Examination from the Taiwan Patent Office.

* cited by examiner

*Primary Examiner* — Kathleen Duda
(74) *Attorney, Agent, or Firm* — Finnegan, Henderson, Farabow, Garrett & Dunner, L.L.P.

(57) ABSTRACT

A pattern forming method is disclosed, which comprises forming a photo resist film on a substrate, irradiating the photo resist film with an energy ray to form a desired latent image pattern, placing the substrate on a spacer provided on a hot plate, heating the photo resist film by using the hot plate, and developing the photo resist film to form a photo resist pattern, wherein an amount of irradiation of the energy ray is set such that the amount of irradiation of the energy ray in an exposure region in which a distance between a back surface of the substrate and an upper surface of the hot plate is long is larger than the amount of irradiation of the energy ray in an exposure region in which a distance between the back surface of the substrate and the upper surface of the hot plate is short.

3 Claims, 4 Drawing Sheets

PATTERN FORMING METHOD AND A SEMICONDUCTOR DEVICE MANUFACTURING METHOD

CROSS-REFERENCE TO RELATED APPLICATIONS

This application is a continuation of Application No. 11/266,197, filed Nov. 4, 2005, now U.S. Pat. No. 7,563,561, and is based upon and claims the benefit of priority from prior Japanese Patent Application No. 2004-322495, filed Nov. 5, 2004, the entire contents of all of which are incorporated herein by reference.

BACKGROUND OF THE INVENTION

1. Field of the Invention

The present invention relates to a pattern forming method, and more particularly, to a pattern forming method for use in a lithography process for fabricating a semiconductor device, and a semiconductor device manufacturing method.

2. Description of the Related Art

With downsizing of a semiconductor element, there has been a demand for a high resolution for a pattern in a lithography process, as described in, for example, Jpn. Pat. Appln. KOKAI Publication No. 2000-277423. To this demand, shorting of the wavelength of an exposure light to be used is promoted. In optical lithography, an ArF excimer laser (wavelength: 193 nm) has been widely used as an exposure light source. On the other hand, with the shorting of the wavelength of the exposure light, a chemically amplified resist has been practically used as a material for a photo resist (resist film) to which a pattern is to be transferred. The chemically amplified resist film contains an acid generator which generates an acid in the resist by exposure. The acid generator decomposes the chemically amplified resist (in the case where the resist is of a positive type) or cross-links the resist (in the case where the resist is of a negative type). As a result, solubility of the resist by a developing solution changes. This feature is utilized to obtain high resolution.

In the lithography process using the chemically amplified resist film, it is practical to carry out a heating process called PEB (Post-Exposure Baking) for diffusing the acid generated at the time of exposure. In the PEB process, since there is an intimate relationship between an amount of heat supplied and a dimension of a resist film pattern formed after exposure, severe temperature uniformity is required with reduction of the size of a pattern to be formed.

In a conventional PEB process, there has been widely used a so-called proximity baking method in which a substrate to be treated is placed above a hot plate heated by a heater to supply heat to the substrate from its back surface. It is general to set a distance (gap) between the hot plate and the substrate to be about 100 μm to shorten the heat time. However, since the substrate having undergone a film forming process or the like has a warp due to a stress of a film, the gap between the hot plate and the substrate becomes non-uniform within the plane of the substrate. This becomes a factor of degrading temperature uniformity within the plane of the substrate.

As another heating method, there is proposed a lamp heating method in which a light is irradiated onto a substrate from a lamp installed above the substrate to heat the substrate. With this method, a substrate warp is not so problematic as compared with the proximity baking method. However, there is a problem that it is difficult to ensure luminance uniformity of the lamp and thus good temperature uniformity within the plane of the substrate cannot be obtained.

There is a demand for a pattern forming method capable of forming a pattern having good dimensional uniformity within the plane of the substrate against a substrate having a warp.

BRIEF SUMMARY OF THE INVENTION

According to an aspect of the present invention, there is provided a pattern forming method comprising:

forming a photo resist film on a substrate;

selectively irradiating the photo resist film with an energy ray to form a desired latent image pattern in each of a plurality of exposure regions of the photo resist film;

placing the substrate on a spacer provided on a hot plate, after forming the latent image pattern;

heating the photo resist film by using the hot plate; and developing the photo resist film to form a photo resist pattern which correspond to the latent image pattern, wherein, when the photo resist film is irradiated with the energy ray, an amount of irradiation of the energy ray is set such that the amount of irradiation of the energy ray in an exposure region in which a distance between a back surface of the substrate and an upper surface of the hot plate is long is larger than the amount of irradiation of the energy ray in an exposure region in which a distance between the back surface of the substrate and the upper surface of the hot plate is short.

According to another aspect of the present invention, there is provided a method of manufacturing a semiconductor device comprising forming a photo resist film on a substrate including a semiconductor substrate, by using a pattern forming method, the pattern forming method comprises;

forming a photo resist film on a substrate including a semiconductor substrate;

selectively irradiating the photo resist film with an energy ray to form a desired latent image pattern in each of a plurality of exposure regions of the photo resist film;

placing the substrate on a spacer provided on a hot plate, after forming the latent image pattern;

heating the photo resist film by using the hot plate; and developing the photo resist film to form a photo resist pattern which correspond to the latent image pattern, wherein, when the photo resist film is irradiated with the energy ray, an amount of irradiation of the energy ray is set such that the amount of irradiation of the energy ray in an exposure region in which a distance between a back surface of the substrate and an upper surface of the hot plate is long is larger than the amount of irradiation of the energy ray in an exposure region in which a distance between the back surface of the substrate and the upper surface of the hot plate is short.

DETAILED DESCRIPTION OF THE INVENTION

Embodiments of the present invention will be described hereinafter with reference to the accompanying drawings.

First Embodiment

A material for forming an antireflection film is coated on a semiconductor substrate or wafer (hereinafter, referred to as "wafer") having a diameter of 200 nm by a spin coating technique. A baking process is carried out under a condition of 190° C. for 60 seconds to form an antireflection film having a film thickness of 80 nm on the wafer.

A material for forming a positive type chemically amplified resist is coated on the wafer thus formed. A heat process (pre-baking) for volatilizing a solvent contained in the resist is carried out under a condition of 130° C. for 60 seconds to form a resist film having a film thickness of 230 nm. After the pre-baking process, the wafer is cooled down to room temperature. After the cooling, the wafer is transferred to a projection aligner which uses an ArF excimer laser (wavelength: 193 nm) as a light source.

Next, a photo mask is prepared, the photo mask having formed thereon a mask pattern which includes a pattern for forming on the wafer an L/S pattern (Line and Space pattern) of 90 nm which is a dimension on the wafer. The mask pattern of the photo mask is projected onto each of the exposure regions of the resist film.

Figure 1:
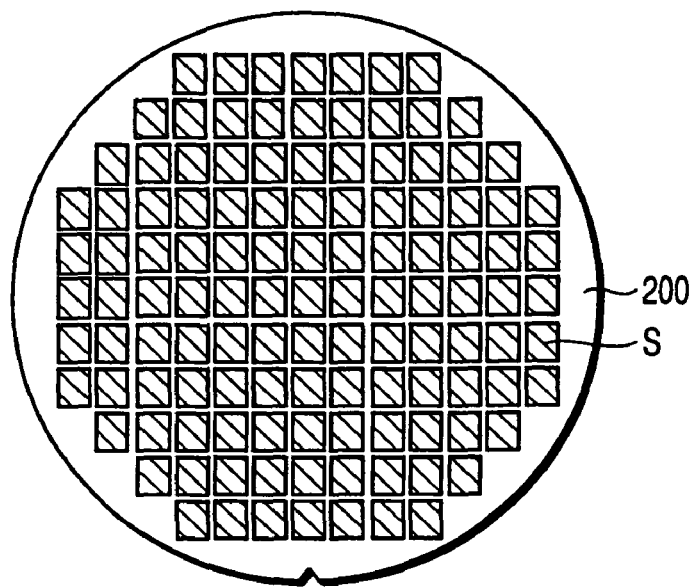
FIG. 1 is a plan view schematically showing a wafer according to a first embodiment of the present invention.

FIG. 1 is a plan view schematically showing the entirety of a wafer 200. As shown in FIG. 1, exposure regions (i.e., an exposure shot) S are formed over the wafer 200. Hereinafter, a method of correcting an amount of exposure will be described in detail.

First, with reference to FIG. 2, there will be described a problem which occurs when an amount of exposure is uniform within the plane of a wafer, as is conventionally. FIG. 2 is a sectional view schematically showing a positional relationship between a wafer and a hot plate used in a heating process called PEB (Post Exposure baking) carried out after exposure.

A hot plate 201 is heated by a heater (not shown) provided on a back surface of the hot plate, and its temperature is controlled by a temperature control unit (not shown) connected to the heater. The wafer 200 is placed on a spacer 203 provided on the hot plate 201 so that the wafer 200 is above the hot plate 201 and spaced from the hot plate 201 by the spacer 203. The spacer 203 is provided in a circumferential shape on an upper surface of the hot plate 201, and the circular edge portion of the wafer 200 is positioned on the circular spacer 203. The spacer 203 prevents a contamination from the hot plate 201 to the back surface of the wafer 200 or a contamination from the back surface of the wafer 200 to the hot plate 201. The wafer 200 is heated in a state in which the wafer is spaced from the hot plate 201 by means of the spacer 203. In general, in an attempt of reducing a heat processing time interval, the spacer 203 has a thickness of as small as about 100 μm.

Figure 2A:
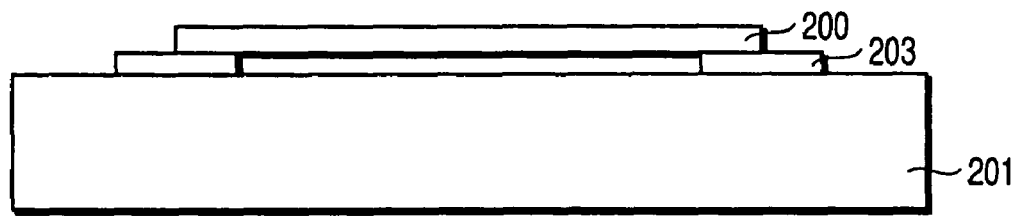
FIGS. 2A and 2B are sectional views schematically showing a positional relationship between a hot plate and a wafer.
Figure 2B:
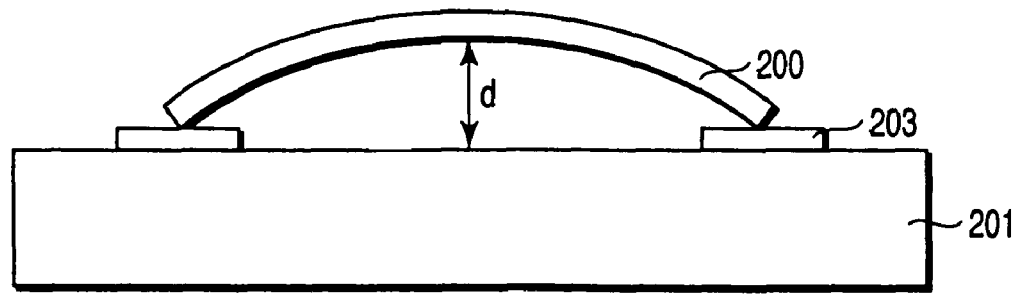

FIG. 2A shows a case in which the wafer 200 is parallel to the hot plate when the wafer is placed on the spacer 203. In general, however, the wafer 200 to which a film forming process or an etching process has been carried out is in a warped shape, as shown in FIG. 2B. Thus, a distance "d" between the upper surface of the hot plate 201 and the back surface of the wafer 200 varies within the plane of the wafer 200. For this reason, an amount of heat supplied from the hot plate 201 to the wafer 200 becomes non-uniform within the plane of the wafer 200. This variation of supplied heat occurs for the reason that the temperature of the hot plate 201 is controlled based on a temperature sensed by a temperature sensor (not shown) embedded in the hot plate 201.

Figure 3:
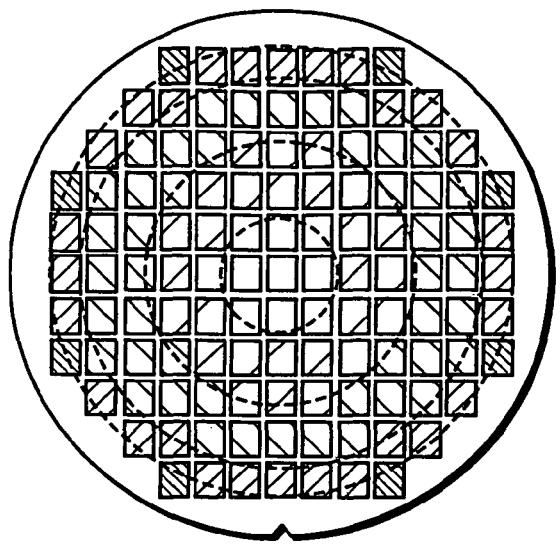
FIG. 3 is a plan view schematically showing a distribution of resist patterns (after a developing process) formed on a wafer heated non-uniformly in a radial direction.

FIG. 3 schematically shows a wafer plane, in particular, a distribution of resist patterns after developing process within the plane of the wafer heated non-uniformly in the wafer radial direction. In FIG. 3, the resist film patterns indicated by the same hatching have the same dimension. As shown in, for example, FIG. 3, in the warped wafer 200, a dimensional variation occurs among the resist patterns within the plane of the wafer due to the non-uniformity of supplied amount of heat at the time of the PEB process.

In the present embodiment, in order to reduce the dimensional variation of the resist patterns caused by the non-uniformity of supplied amount of heat within the plane of the wafer at the time of the PEB process, a correcting table for correcting an amount of exposure is prepared in advance of the PEB process, and exposure is carried out at an amount of exposure calculated based on the correcting table. Now, a method of obtaining a correcting table for correcting an amount of exposure will be described.

Figure 4:
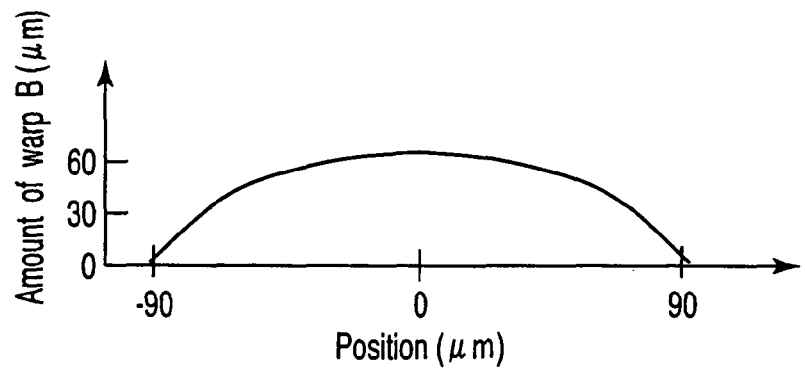
FIG. 4 is a characteristic diagram showing an example of wafer warp amount measured in the radial direction of the wafer.

A plurality of wafers having different amounts of warp are prepared, and an amount of warp within the plane of each of the wafers after resist has been coated on the wafers is measured by using a film stress measuring instrument FLX5400 available from KLA Tencor Co., Ltd. Here, a wafer warp amount B is defined as follows. FIG. 4 shows an example of wafer warp amount data when the amount of warp is measured in the wafer radial direction, wherein the data is leveled at two measurement points (i.e., x=±90 mm when the wafer center is defined as x=0) which are the most distant from the center of the wafer. A leveling reference line is defined as an amount of warp 0 (zero), and, with respect to each of the plurality of wafers of different warp amounts, a distance "x" from the center of the wafer and the amount of warp B(x) at the position of distance "x" are obtained.

Figure 5:
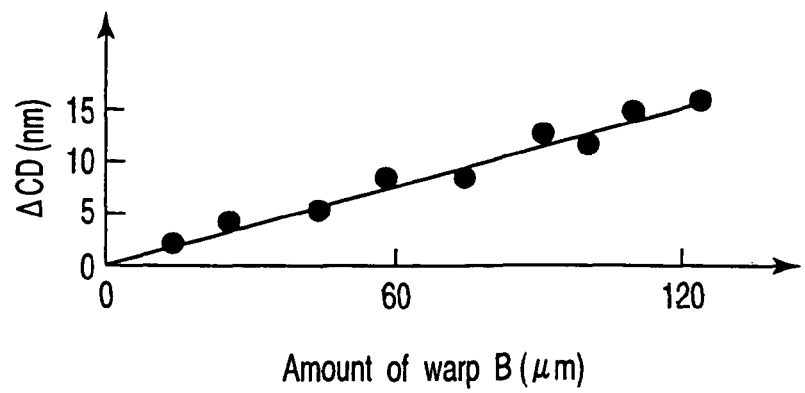
FIG. 5 is a view showing a relationship between an amount of warp B and a CD error ΔCD (i.e., difference from CD when the amount of warp B=0) in each warp amount.

Subsequently, an exposure process, a PEB process, and a developing process are carried out for the resist film on each of the wafers to form resist patterns. Next, pattern dimensions CD at positions within the plane of each of the wafer are monitored by using a scanning electronic microscope, and a relationship between the amount of warp B measured by the stress measuring instrument and the CD error ΔCD (a difference from CD when the amount of warp B=0) in each warp amount is calculated (FIG. 5).

Figure 6:
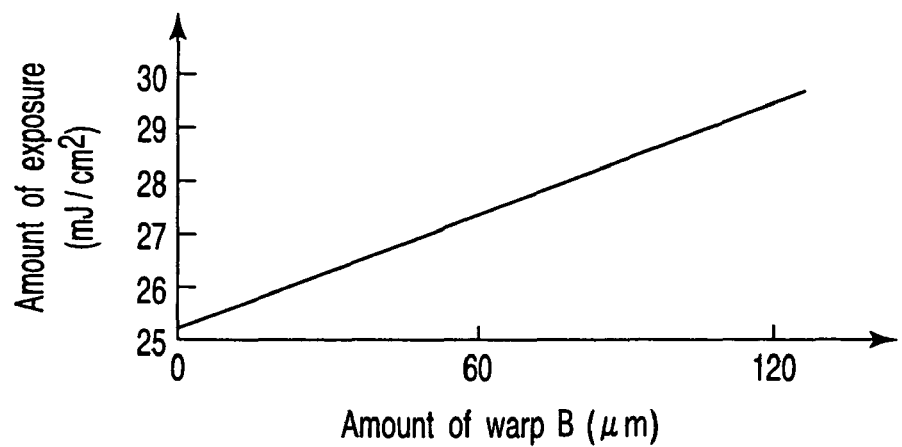
FIG. 6 is a view showing a relationship between the amount of warp B and a set amount of exposure for obtaining a desired pattern (90 nm L/S pattern)

Further, a relationship between an amount of exposure and CD is obtained. From the obtained relationship between the amount of exposure and the CD, a relationship between the amount of warp B and the set amount of exposure is calculated to obtain a desired pattern (90 nm L/S pattern) (FIG. 6), and a correcting table for correcting an amount of exposure is obtained.

Figure 7:
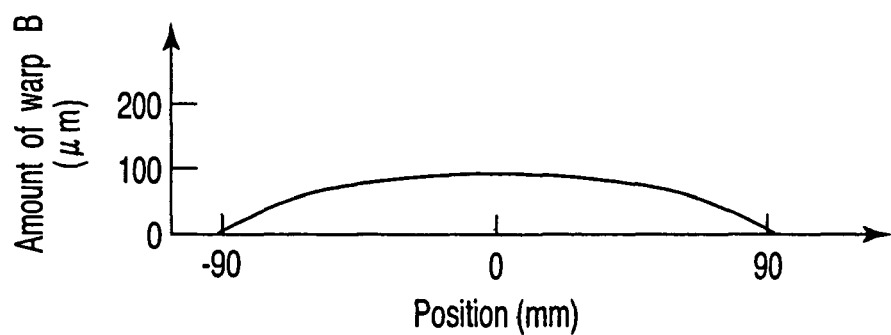
FIG. 7 is a view showing an average value of warp amounts of 24 wafers according to the first embodiment of the present invention.
Figure 8:
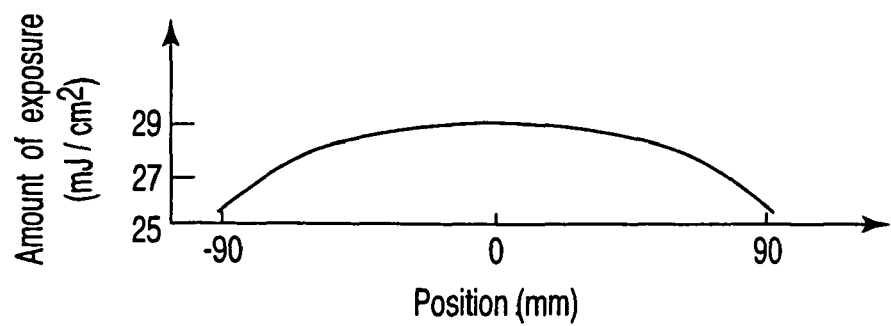
FIG. 8 is a view showing a set amount of exposure obtained from the average value shown in FIG. 7.

FIG. 7 shows an average value of the amounts of warp of 24 wafers according to the present embodiment. From the average value of the amounts of warp shown in FIG. 7, a relationship, i.e., a correcting table for correcting an amount of exposure, between positions within the plane of a wafer and set amounts of exposure, is obtained. The correcting table thus obtained is shown in FIG. 8. Exposure is carried out at the set amount of exposure according to a distance (position) from the center of the wafer to form a latent image in the resist film. Next, the wafer is transferred to a PEB unit, and a PEB process is carried out under a condition of 130° C. for 60 seconds. After the PEB process, the wafer is cooled down to room temperature.

Subsequently, the wafer is transferred to a developing unit, and a developing process is carried out with an alkaline developing solution. After the developing process has been carried out, a rinse process and a spin drying process are carried out to form a resist pattern.

In an experimental example under the above condition, dimensions of the resist patterns formed on a wafer were measured after the developing. A dimensional difference between a pattern at the center of the wafer and a pattern at an end of the wafer was 1.1 nm. On the other hand, a dimensional difference in the case where correction corresponding to the distance "d" is not carried out (i.e., prior art) was 11.3 nm. It was therefore confirmed that the dimensional difference is remarkably reduced by using the technique according to the present embodiment. As a result, the yield in a semiconductor device can be significantly improved.

In the embodiment, a corrected amount of exposure (FIG. 8) is calculated from an average warp amount (FIG. 7) of a plurality of wafers, and the calculated exposure amount is defined as a corrected exposure amount for all of the wafers, however, the present invention is not limited thereto. In order to control CD more precisely, the amount of correction may be changed wafer by wafer on the basis of the warp amount data for each wafer.

Further, in the embodiment, a wafer warp amount is measured after coating the resist film, however the present invention is not limited thereto. A wafer warp amount measured before forming the antireflection film or before forming the resist film may be used.

Moreover, although the present embodiment describes a correction of an amount of exposure for each of the exposure shots, however, the present invention is not limited thereto. In the case of using a scanning projection aligner in which a substrate and a photo mask are moved in parallel to each other and in the same direction, it is possible to correct the amount of exposure in an exposure shot by adjusting the moving speed and/or scan speed. At this time, the corrected amount can be obtained in a method similar to that used in the present embodiment. The correction in a direction orthogonal to the scan direction cannot be carried out by the projection aligner. However, correction can be carried out at the time of developing by using a developing device described in Jpn. Pat. Appln. KOKAI Publication No. 2002-252167, in which a developing solution supply/recovery nozzle for supplying/recovering a developing solution carries out scanning from one end to the other end of the substrate to carry out developing. The developing device can carry out a developing process in a local region. A scan direction of the developing solution supply/recovery nozzle at the time of developing is set in a direction orthogonal to the moving direction of the substrate at the time of exposure. Further, the scan speed of the developing solution supply/recovery nozzle in an exposure region in which a distance is long may be set so as to be lower than the scan speed of the developing solution supply/recovery nozzle in an exposure region in which the distance is short.

In addition, in the present embodiment, the corrected amount of exposure is obtained by measuring the resist film dimensions within the plane of the wafer to each warp amount, however, the present invention is not limited thereto. For example, the corrected amount of exposure may be obtained by using a monitor pattern for monitoring the corrected amount of exposure formed on a photo mask, as described in Jpn. Pat. Appln. KOKAI Publication No. 2001-102282. The corrected amount of exposure can be calculated based on dimensions of a latent image of a monitor mark that is formed in a resist film and corresponds to the monitor pattern formed on the photo mask.

The monitor patterns formed on the photo mask are intermittently or continuously arranged in one direction at a pitch P which meets a condition that $1/P \geq (1+\sigma) NA/\lambda$, where a wavelength of an exposure light of a scanning projection aligner is $\lambda$, a numerical aperture is NA, and a coherent factor is $\sigma$. In addition, an energy ray exposing a resist film is defined as an ultraviolet ray or a far-ultraviolet ray, and a latent image pattern may be formed by using the scanning projection aligner.

Second Embodiment

In a second embodiment, an amount of warp of a wafer is measured at a stage before exposure, and a corrected amount of exposure is set based on a result of the measurement. Since this embodiment is different from the first embodiment only in a procedure of calculating a corrected amount of exposure, a duplicate description is omitted.

Figure 9:
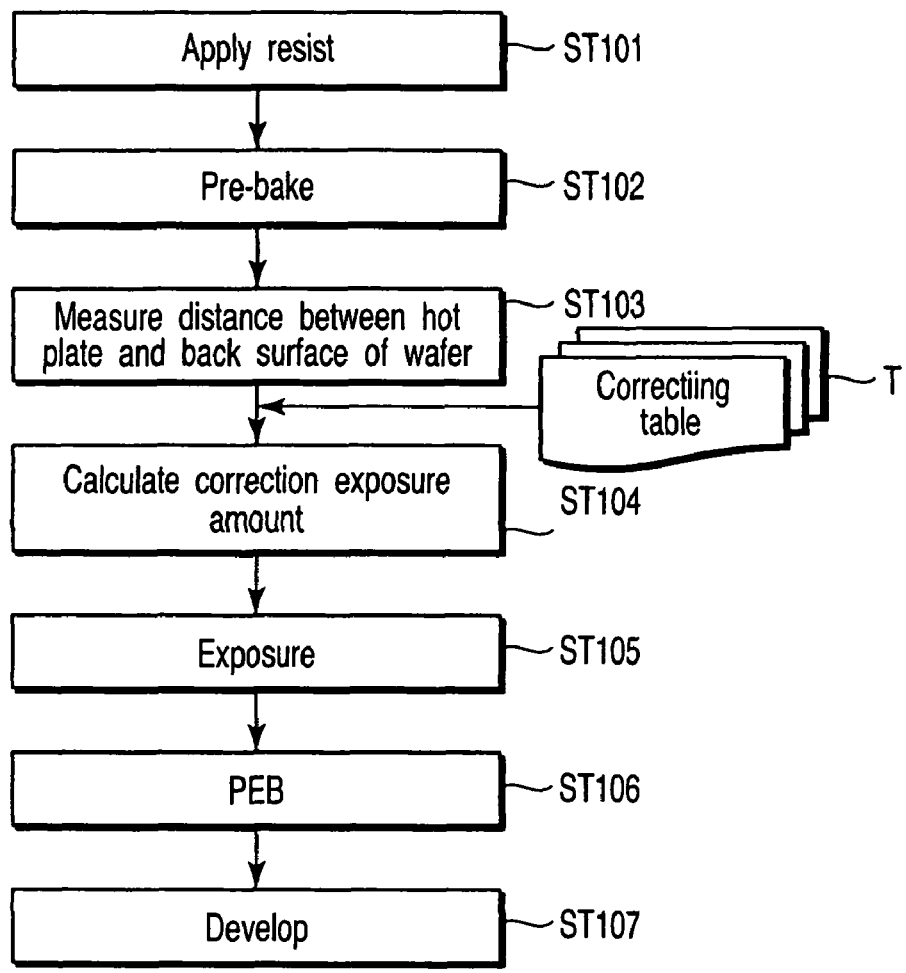
FIG. 9 is a flow chart showing operating procedures according to a second embodiment of the present invention.

FIG. 9 is a flow chart explaining a flow of processes according to the second embodiment. In the pre-baking (i.e., baking after coating a resist film), a distance "d" between the back surface of a wafer and the hot plate is measured during the process, and a corrected amount of exposure is calculated based on the distance. A detailed description will be given below.

Figure 10:
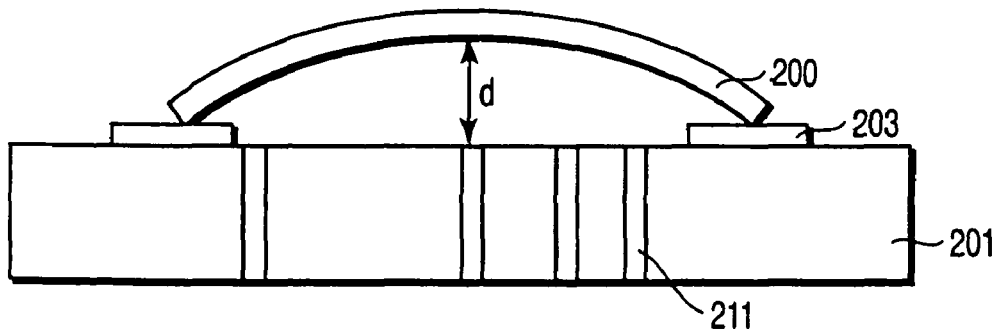
FIG. 10 is a view schematically showing a cross section of a baking unit according to the second embodiment of the present invention.

First, a resist film is formed on a semiconductor substrate (step ST101). Next, a pre-baking process is carried out (step ST102). FIG. 10 schematically shows a cross section of a baking unit for pre-baking the resift film. A hot plate 201 is heated by a heater (not shown) formed on a back surface of the hot plate, and a temperature of the heater is controlled by a temperature control unit (not shown) connected to the heater. A wafer 200 is spaced from the hot plate 201 by a spacer 203 and heated by the hot plate 201. The spacer 203 is the same as that used in the baking process carried out after exposure in thickness, size, and position and number within the wafer plane. A plurality of holes, each of which has a diameter of 2 mm, are formed on the hot plate 201 so as to penetrate from the back surface of the hot plate 201 to an upper surface of the hot plate 201. Heads 211 of laser displacement gauges are embedded in these holes from the back surface of the hot plate 201 to the upper surface of the hot plate 201. Laser beam is irradiated from the head 211 of each of the laser displacement gauges to the back surface of the wafer 200, and reflection laser beam from the back surface of the wafer 200 is received by the head 211, thereby measuring a distance between the hot plate and the back surface of the wafer at the position of the head 211 based on the intensity of the reflection laser beam. An interpolating process is carried out based on data (i.e., distance "d") at four positions during pre-backing of the resist film, thereby obtaining a relationship between positions in the radial direction of the wafer and distances "d" between the hot plate and the back surface of the wafer (step ST103).

Prior to pre-baking, a relationship between the distance "d" and a corrected amount of exposure for forming a desired pattern (i.e., a correcting table T for correcting the amount of exposure) is obtained. A corrected exposure amount for a wafer region at each of the shot positions is calculated from the correcting table obtained in advance of pre-baking and the distance "d" measured during pre-baking process (step ST104).

An exposure process is carried out by using the calculated amount of exposure for the wafer region at each shot position (step ST105). A PEB process is carried out (step St106), and then, a developing process is carried out (step St107).

The sizes of the developed resist patterns were measured. The dimensional difference between a pattern at the center of the wafer and a pattern at an end thereof was 1.1 nm. A dimensional difference in the case where correction corresponding to the distance "d" is not carried out was 11.3 nm. Thus, it was confirmed that the dimensional difference is remarkably reduced by using the technique according to the embodiment. As a result, the yield in a semiconductor device can be significantly improved.

In the present embodiment, the distance "d" is directly obtained by using the laser displacement gauge, however, the present invention is not limited thereto. For example, the correction of exposure amount may be carried out by measuring a temperature of the back surface of the wafer with a radiation temperature meter, and by indirectly obtaining the distance "d" from a conversion table for the back surface temperature and the distance "d".

In each of the embodiments, any of an ultraviolet ray, a far-ultraviolet ray, a vacuum ultraviolet ray, an electron beam, and an X-ray can be used as an energy ray of exposing a resist film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
    forming a photo resist film on a substrate;
    selectively irradiating the photo resist film with an energy ray to form a desired latent image pattern in each of a plurality of exposure regions of the photo resist film;
    placing the substrate on a spacer provided on a hot plate, after forming the latent image pattern;
    heating the photo resist film by using the hot plate; and
    developing the photo resist film to form a photo resist pattern which corresponds to the latent image pattern,
    wherein, when the photo resist film is irradiated with the energy ray, an amount of irradiation of the energy ray is set based on a non-uniformity of an amount of heat supplied at heating the photo resist film on the substrate.

2. The pattern forming method according to claim 1, wherein the non-uniformity of amount of heat supplied at heating the photo resist film on the substrate corresponds to an amount of warp of the substrate.

3. The pattern forming method according to claim 2, wherein the amount of warp of the substrate is an amount of warp of the photo resist film formed on the substrate.

* * * * *